US006998789B2

(12) United States Patent
Uchida

(10) Patent No.: US 6,998,789 B2
(45) Date of Patent: Feb. 14, 2006

(54) ORGANIC ELECTROLUMINESCENT DEVICE, METHOD FOR DRIVING THE SAME, ILLUMINATION DEVICE, AND ELECTRONIC APPARATUS

(75) Inventor: Masahiro Uchida, Chino (JP)

(73) Assignee: Seiko Epson Corporation, Tokyo (JP)

( * ) Notice: Subject to any disclaimer, the term of this patent is extended or adjusted under 35 U.S.C. 154(b) by 36 days.

(21) Appl. No.: 10/860,158

(22) Filed: Jun. 4, 2004

(65) Prior Publication Data

US 2005/0012465 A1 Jan. 20, 2005

(30) Foreign Application Priority Data

Jun. 13, 2003 (JP) ............................ 2003-169442

(51) Int. Cl.
*G09G 3/10* (2006.01)

(52) U.S. Cl. .................................... 315/169.2; 313/504

(58) Field of Classification Search ................ 315/167, 315/169.1–169.4; 313/503–506, 412–414, 313/441; 345/39–46, 76

See application file for complete search history.

(56) References Cited

U.S. PATENT DOCUMENTS

| | | | | |
|---|---|---|---|---|
| 6,727,660 | B1 * | 4/2004 | Heller | 315/169.2 |
| 6,812,638 | B1 * | 11/2004 | Wakimoto et al. | 313/505 |
| 6,864,863 | B1 * | 3/2005 | Kasai | 345/39 |
| 6,876,007 | B1 * | 4/2005 | Yamazaki et al. | 313/504 |

FOREIGN PATENT DOCUMENTS

| | | |
|---|---|---|
| JP | A 01-163996 | 6/1989 |
| JP | 06-342690 | 12/1994 |
| JP | A 07-176383 | 7/1995 |
| JP | 08-279627 | 10/1996 |
| JP | A 11-024606 | 1/1999 |
| JP | 2000-331781 | 11/2000 |
| JP | A 2003-157983 | 5/2003 |
| JP | A 2003-303683 | 10/2003 |

* cited by examiner

*Primary Examiner*—Wilson Lee
(74) *Attorney, Agent, or Firm*—Oliff & Berridge, PLC

(57) ABSTRACT

The invention provides an organic EL device and a method for driving the organic electroluminescent device, that is adapted to perform satisfactorily multicolor (plural colors) luminescence with a simplified structure, and to provide an illumination device and electronic apparatus including the organic electroluminescent device. The device can include a first electrode, a second electrode and a third electrode that are formed on a substrate. A first organic luminescence layer can be formed between the first electrode and the second electrode, and a second organic luminescence layer can be formed between the second electrode and the third electrode. The first electrode and the third electrode are electrically coupled to each other. The second electrode has transparency, and at least one of the first electrode and the third electrode has transparency. There can also be included a power switching unit for enabling switching between forward driving which allows the first electrode and the third electrode to serve as an anode and allows the second electrode to serve as a cathode, and inverse driving which allows the first electrode and the third electrode to serve as a cathode and allows the second electrode to serve as an anode.

11 Claims, 2 Drawing Sheets

ORGANIC ELECTROLUMINESCENT DEVICE, METHOD FOR DRIVING THE SAME, ILLUMINATION DEVICE, AND ELECTRONIC APPARATUS

BACKGROUND OF THE INVENTION

1. Technical Field of Invention

The invention relates to an organic electroluminescent device used for a light source or a display and a method for driving the organic electroluminescent device. Further, the invention relates to an illumination device and electronic apparatus including the organic electroluminescent device.

2. Description of Related Art

Conventionally, it is well known for an organic electroluminescent device (organic EL device) that each element structure is alternately formed in a film type and multicolor display is performed in accordance with full colorization through composition of those light components, so that three primary colors of light can be emitted by a dot matrix method. However, this multicolor display has naturally a complicated structure, and then has high cost, thereby becoming a high price product that much.

On the other hand, in case of using an organic EL device as, for example, a backlight or a illumination, there is a demand for simplifying of the structure of the device by simplifying the display even though performing a multicolor (plural colors) luminescence, and then producing the device cheaply that much, instead of enabling a complicated display by full colorization. It is well known for an organic EL device capable of responding to this demand. See, for example, Japanese Unexamined Patent Application Publication No. 6-342690, Japanese Unexamined Patent Application Publication No. 8-279627, and Japanese Unexamined Patent Application Publication No. 2000-331781.

SUMMARY OF THE INVENTION

However, according to the conventional art disclosed above, there is a problem that a control for making a plurality of luminescence colors satisfactorily displayed is difficult. Further, according to the conventional art disclosed above, there is a problem that the structure also becomes complicated because of the necessity of patterning the electrodes of both sides and the like.

The invention is made in consideration of these situations, and its object is to provide an organic EL device that is adapted to perform satisfactorily a multicolor (plural colors) luminescence with a simplified structure, a method for driving the organic EL device, and an illumination device and electronic apparatus including the organic EL device.

The organic EL device according to the invention can include a first electrode, a second electrode, and a third electrode formed on a substrate in that order; a first organic luminescence layer disposed between the first electrode and the second electrode and formed of at least one layer; a second organic luminescence layer disposed between the second electrode and the third electrode and formed of at least one layer, the first electrode and the third electrode being electrically connected to each other, the second electrode having transparency, and at least one of the first electrode and the third electrode having transparency; and a power switching unit for enabling switching between forward driving which allows the first electrode and the third electrode to serve as an anode and allows the second electrode to serve as a cathode, and inverse driving which allows the first electrode and the third electrode to serve as a cathode and allows the second electrode to serve as an anode.

In the organic EL device, if a forward bias is applied, a hole can be injected into a luminescence layer from an anode side, an electron is injected into the luminescence layer from a cathode side, and the hole and the electron are recombined within the luminescence layer, thereby causing luminescence to be generated. On the other hand, when an inverse bias is applied, the injection of the hole or the electron from each electrode is not properly performed, so that the luminescence does not occur.

Herein, the organic EL device enables the luminescence of plural colors by applying the principle that the luminescence occurs during the application of the forward bias and the luminescence does not occur during the application of the inverse bias, as described above.

In other words, a first organic luminescence layer is disposed between a first electrode and a second electrode, and a second organic luminescence layer is disposed between the second electrode and a third electrode. As a result, in case of performing forward driving in which the first electrode and the third electrode serves as an anode and the second electrode serves as a cathode, one organic luminescence layer get luminescence in accordance with the application of a forward bias, while the other organic luminescence layer does not get luminescence in accordance with the application of an inverse bias. Similarly, in case of performing inverse driving in which the first electrode and the third electrode serves as the cathode and the second electrode serves as the anode, the other organic luminescence layer get luminescence in accordance with the application of the forward bias, while one organic luminescence layer does not get luminescence in accordance with the application of the inverse bias. Accordingly, by previously setting both of the luminescence in the first organic luminescence layer and the luminescence in the second organic luminescence layer, that is, the luminescence colors by the first and second organic luminescence layers, and then by switching between forward driving and inverse driving via a power switching unit, it becomes possible to cause the luminescence of plural colors to be generated.

Further, since it basically becomes possible to cause the luminescence of the plural colors to be generated by adding the electrode and the organic luminescence layer to the conventional structure, the organic EL device is capable of satisfactorily performing the luminescence of the multicolor (plural colors) with a simplified structure.

Further, in the organic EL device, it is preferable that the first organic luminescence layer be made of a polymer material and the second organic luminescence layer be made of a monomer material. If doing so, after forming, in particular, the first organic luminescence layer in a film type with a wet method using the polymer material, each of the second electrode, the second organic luminescence layer and the third electrode can be formed thereon with a film forming method under a vacuum atmosphere or a decompressed atmosphere of a vapor deposition method, a sputter method, and the like. Accordingly, it can prevent deterioration due to oxygen or moisture in the first organic luminescence layer, particularly.

Further, in the organic EL device, the luminescence of at least the first organic luminescence layer of the first and second organic luminescence layers is preferably driven in a passive matrix manner. Since relatively complicated display in the first organic luminescence layer becomes possible, and also single color can be displayed by the second organic luminescence layer, the degree of freedom of the display can be enhanced.

Further, in the organic EL device, preferably, the first electrode includes a plurality of stripe-shape electrodes arranged in parallel to each other, and the second electrode includes a plurality of stripe-shape electrodes arranged in parallel to each other and arranged to perpendicularly cross the first electrode. Accordingly, it can possible to cause the luminescence in the first organic luminescence layer by a passive dot matrix driving, thereby performing more complicated display in the first organic luminescence layer.

Further, in the organic EL device, preferably, the third electrode can include a plurality of stripe-shape electrodes arranged in parallel to each other and the stripe-shape electrodes are arranged directly above the first electrode. If doing so, as viewing from a direction perpendicular to the substrate, that is, a direction that luminescent light is emitted, the third electrode is arranged in a same position as that of the first electrode and to overlap the first electrode. Accordingly, it can generate the luminescence by the same passive dot matrix driving in the first organic luminescence layer and the second organic luminescence layer.

Further, in the organic EL device, the power switching unit is preferably provided with a control unit for respectively controlling an application time and amount of a forward bias when forward driving is performed, and an application time and amount of an inverse bias when inverse driving is performed. If done, when, for example, performing switching between forward driving and inverse driving by the power switching unit at high speed that can not be followed by human eyes, the application time and amount of the bias is suitably adjusted. Accordingly, it seemingly becomes possible to display the colors composed with the first organic luminescence layer and the second organic luminescence layer.

A method for driving the organic EL device of the invention can include making a difference between an application time of a forward bias in forward driving and an application time of an inverse bias in inverse driving when performing switching between forward driving and inverse driving at high speed.

According to the method for driving the organic EL device, the difference between the application time of the forward bias and the application time of the inverse bias is suitably changeable. Accordingly, it becomes possible to allow the color obtained by composition of the color from the first organic luminescence layer and the color from the second organic luminescence layer to be displayed in a good gray scale level.

An another method for driving the organic EL device of the invention can include making a difference between the application amount of a forward bias in forward driving and the application amount of an inverse bias in inverse driving when performing switching between forward driving and inverse driving at high speed.

According to the method for driving the organic EL device, the difference between the application amount of the forward bias and the application amount of the inverse bias is suitably changeable. Accordingly, it becomes possible to allow the color obtained by composition of the color from the first organic luminescence layer and the color from the second organic luminescence layer to be displayed in a good gray scale level.

Even an another method for driving the organic EL device of the present invention comprises making a difference between an application time and amount of a forward bias in forward driving and an application time and amount of an inverse bias in inverse driving, respectively, when performing switching between forward driving and inverse driving at high speed.

According to the method for driving the organic EL device, the respective difference between the application time and amount of the forward bias and the application time and amount of the inverse bias is suitably changeable. Accordingly, it becomes possible to allow the color obtained by composition of the color from the first organic luminescence layer and the color from the second organic luminescence layer to be displayed in a better gray scale level.

An illumination device of the invention can use the organic EL device as a light source. According to the illumination device, since the light source is the organic EL device that is capable of performing satisfactorily multicolor (plural colors) luminescence with a simplified structure, the illumination device itself can perform the multicolor (plural colors) luminescence with a simplified structure.

An electronic apparatus of the invention can include the organic EL device. According to the electronic apparatus, since it includes the organic EL device that is capable of performing satisfactorily the multicolor (plural colors) luminescence with a simplified structure, the electronic apparatus itself can perform the multicolor (plural colors) luminescence with a simplified structure.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Figure 1:
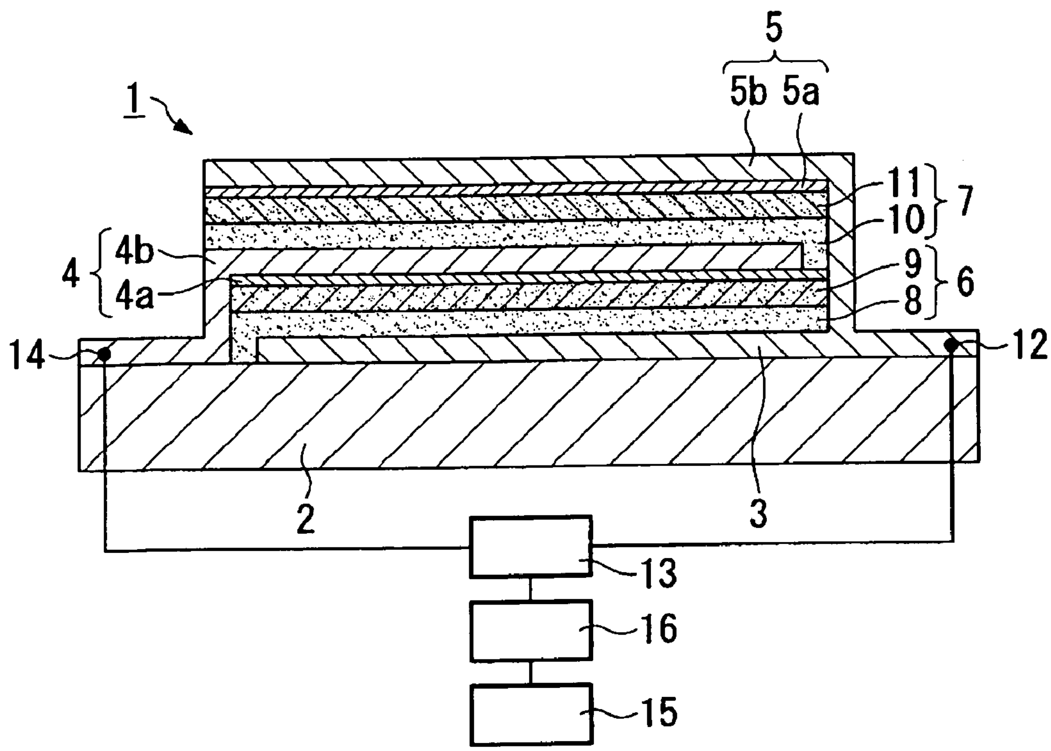
FIG. 1 is a schematic structural view of an organic EL device.

Hereinafter, the present invention will be described in detail by way of embodiments. FIG. 1 shows an embodiment of an organic EL device according to the invention. In FIG. 1, a reference numeral "1" represents an organic EL device. The organic EL device 1 is a so-called bottom emission type that luminescent light is emitted from a substrate 2 side. On the substrate 2, a first electrode 3, a second electrode 4 and a third electrode 5 are formed in that order. A first organic luminescence layer 6 is formed between the first electrode 3 and the second electrode 4, and a second organic luminescence layer 7 is formed between the second electrode 4 and the third electrode 5. Further, in the present embodiment, any one of the first electrode 3, the second electrode 4 and the third electrode 5 has a solid film structure made of a single-layered film or a deposited film, which is not patterned.

Since the substrate 2 makes a luminescent light to be emitted therefrom as described above, it is formed of a transparent material, such as a transparent glass or quartz.

In addition, since the first electrode 3 allows the luminescent light in the first organic luminescence layer 6 and the second organic luminescence layer 7 to be transmitted as described below, it is formed of a transparent conductive material. As the transparent conductive material, it is preferable to use ITO. Besides, for example, indium oxide-based and zinc oxide-based amorphous transparent conductive film (Indium Zinc Oxide (IZO)) (Registered Trademark) (Manufactured by Idemitsu Kosan Co., Ltd.) and the like can be used. In the present embodiment, ITO is used.

Further, if necessary, on a surface of ITO (the first electrode 3), O2 plasma treatment may be conducted. As a result, the cleaning of the electrode surface and the adjustment of the work function may be performed, and further the lyophilic may be allowed.

In the embodiment, the first organic luminescence layer 6 formed and arranged on the first electrode 3 consists of a first hole injecting layer 8 and a first luminescence layer 9. The first hole injecting layer 8 and the first luminescence layer 9 can be formed and arranged in that order from the first electrode 3 side.

The first hole injecting layer 8 is made of a material formed by adding, for example, polystyrenesulfonic acid to polythiophene derivative and polypyrrole derivative. That is, specifically, the material for forming the first hole injecting layer 8 may include 3,4-polyethylenediothiophene/polystyrenesulfonic acid (PEDOT/PSS=1/20), and the like.

Further, a polar solvent (dispersion medium) may include glycol ethers, such as isopropyl alcohol (IPA), normal butanol, g-butyrolactone, N-methyl pyrrolidone (NMP), 1,3-dimethyl-2-imidazolidinone (DMI) and its derivatives, carbitolacetate, butyl carbitolacetate, and the like, instead of water.

Further, for the forming material of the first hole injecting layer 8, it may use various materials without being limited to the above-mentioned materials. For example, materials formed by allowing polystyrene, polypyrrole, polyaniline, polyacetylene or their derivatives to be dispersed in the appropriate dispersion medium, for example, the polystyrenesulfonic acid can be used.

The first luminescence layer 9 can be formed of a well-known luminescence material that is capable of emitting fluorescent light or phosphorescent light. Specifically, a polymer material, in particular, may be used. The polymer material includes (poly)paraphenylenevinylene derivative, polyphenylene derivative, polyfluorene derivative, polyvinyl carbazole, polythiophene derivative, perylene-based pigment, coumarin-based pigment, rhodamine-based pigment, and the like. Further, a material formed by doping rubrene, perylene, 9,10-diphenyl anthracene, tetraphenyl butadiene, nile red, coumarin 6, quinacridone, and the like to these polymer materials may be used. Further, in the embodiment, the polymer materials for red color luminescence are exemplarily used, but the polymer materials for blue or green color luminescence may be used.

Further, for the forming material of the first luminescence layer 9, a luminescence material made of a monomer material may be used. Similarly, in this case, the luminescence color may be optionally selected and used. However, in case of forming the first luminescence layer 9 with a monomer material, it is preferable to form the first organic luminescence layer 6 by depositing a hole transporting layer, a luminescence layer and an electron transporting layer in that order from the first electrode 3 side. The hole transporting layer is formed of a hole transportation material such as a-NPD or TPD and the like. It is preferable to form in a laminated structure of a hole injecting material using star-burst type amine, etc., and the hole transporting material. For the monomer material used for forming the luminescence layer, a material formed by doping a fluorescent pigment (rubrene or quinacridone, DCM, and the like) by a little amount to an electron transporting luminescence material, such as Alq3 may be used. In addition, for the electron transporting layer, a material, such as Alq3 or PBD may be used.

In case of using the polymer materials as the luminescence materials, for a solvent liquidizing the polymer materials, a non-polar solvent insoluble to the first hole injecting layer 8 such that the first hole injecting layer 8 may not be dissolved again may be used. In particular, if the material of forming the luminescence layer is applied using a spin coating method or a dipping method as described below, toluene, xylene, and the like are suitably used as the non-polar solvent. In addition, if it is applied using a droplet ejecting method such as an ink jet method, dihydrobenzofran, trimethylbenzene, tetramethylbenzene, cyclohexyl benzene, or their mixtures may be used.

The second electrode 4 is formed of a transparent conductive material to transmit light from the second organic luminescence layer 7 as described below. For the transparent conductive material, a material to allow especially the second electrode 4 to serve as a cathode with respect to the first organic luminescence layer 6 may be used. For the second electrode 4, it is suitably adapted to have a laminated structure of a ultra-thin film cathode 4*a* having an electron injectability made of, for example, a metal having a small work function or its fluoride/oxide and a codeposition film of BCP (Bathocuproine) and cesium which is a mixture with an organic material, and a transparent electrode 4*b* made of ITO or IZO to grant the conductivity. The ultra-thin film cathode 4*a* having the electron injectability is arranged at the first organic luminescence layer 6 side, and the transparent electrode 4*b* is arranged at the second organic luminescence layer 7 side. In addition, for the ultra-thin film 4*a*, it may be good to use Ca with the thickness of 5 nm, instead of the codeposition film of bathocuproine and cesium.

The second organic luminescence layer 7, like the first organic luminescence layer 6, can include the second hole injecting layer 10 and the first luminescence layer 11, which are formed and arranged in that order from the second electrode 4 side. The second hole injecting layer 10 is formed of the same material as the first hole injecting layer 8, and the second luminescence layer 11 is formed of the same material as the first luminescence layer 9. However, it can be possible for the second luminescence layer 11 to achieve color different from the luminescence color of the first luminescence layer 9. For example, in case that the first luminescence layer 9 is formed of a material causing the red luminescence as described above, the second luminescence layer 11 may be formed of a material causing the blue luminescence, for example.

Further, for the second luminescence layer 11, in particular, it is preferable to use a luminescence material formed of a monomer material, not a polymer material, due to the manufactural reason as described below. In that case, the second organic luminescence layer 7 is preferably formed by sequentially depositing the hole transporting layer, the luminescence layer and the electron transporting layer in that order from the second electrode 4 side as described above. The hole transporting layer can preferably be formed of a hole transporting material such as a-NPD or TPD. Further, it is preferable to form it in a laminated structure of a hole injecting material using a material such as a star-burst type amine and the hole transporting material. Further, for the monomer material for forming the luminescence layer, a material formed by doping a fluorescent pigment (rubrene or quinacridone, DCM and the like) by a little amount to the electron transporting luminescence material such as Alq3, for example, may be used. However, for a material causing the blue luminescence, DDPI may be suitably used. In addition, for the electron transporting layer, it may be used, for example, Alq3, PBD and the like.

For the third electrode 5, a laminated structure of the ultra-thin film cathode 5*a* of the electron injectability, that is, a codeposition film of BCP (Bathocuproine) and cesium, and the reflecting electrode 5*b* of Al and the like, may be used. However, in case of using the monomer material for forming the second luminescence layer 11, it may be suitably used MgAg or LiF/Al for the third electrode 5.

In addition, in case of making the third electrode 5 transparent, and allowing a top emission type to be served, as well as a bottom emission type to be served, it may used a laminated structure formed by depositing the ultra-thin film (several nm) made of a metal, such as Ca having a small work function or a mixture of its fluoride or an organic material, and a transparent conductive film made of a material such as ITO.

In addition, on each layer deposited on the substrate 2 by doing so, a sealing member, which is not shown, is provided to cover the organic EL element consisting of the layers. For the sealing member, it may be used, for example, a sealing substrate of a plate shape having an electrical insulation property. In case of using the sealing substrate, the sealing substrate can be fixed to the substrate 2 by a sealing resin in a state of covering the organic EL element. For the sealing resin, it may be suitably used, for example, a thermosetting resin or an ultraviolet curable resin, particularly, epoxy resin, which is a kind of the thermosetting resin. In addition, it may be advantageous to cover and seal the organic EL element using only the sealing resin, without using the sealing substrate.

In the organic EL device 1 having such a structure, the first electrode 3 and the third electrode 5 are electrically coupled to each other by consecutively forming their portions or by connecting through a wiring line. Further, the first electrode 3 and the third electrode 5 are electrically connected to the power switching unit 13 at a first terminal 12 in the substrate 2 side. In addition, the second electrode 4 is electrically connected to the power switching unit 13 at a second terminal 14 in the substrate 2 side.

Figure 2:
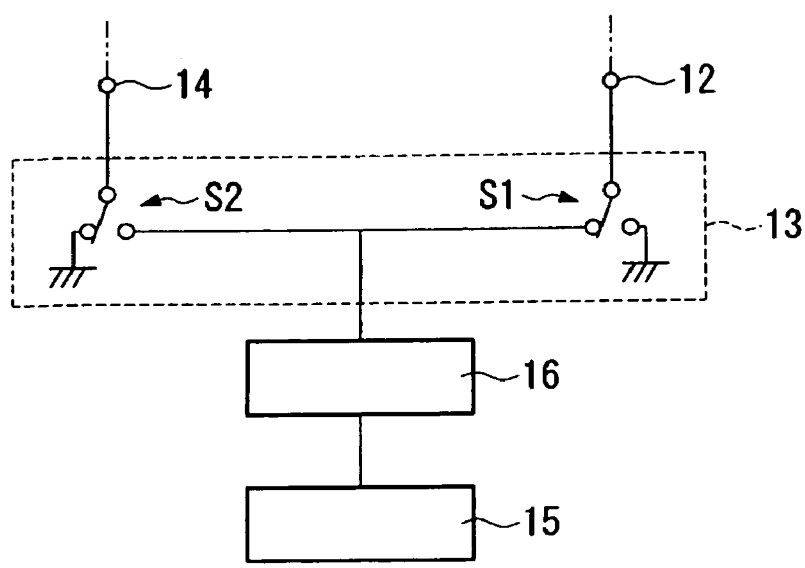
FIG. 2 is a view illustrating a power switching unit.

As shown in FIG. 2, the power switching unit 13 is coupled to a constant current electric power source part 15 for driving the organic EL device 1 via a control unit 16, and switching-controls switch circuits S1 and S2 consisting of, for example, transistor, FET, relay, and the like. Further, one of the switch circuits S1 and S2 is connected to the first terminal 12, and the other of the switch circuits S1 and S2 is connected to the second terminal 14. Accordingly, the power switching unit 13 is supposed to control the luminescence driving of the organic EL device 1. Herein, the control unit 16 is intended to control a voltage (bias) to be applied to the power switching unit 13 from the constant current electric power source part 15. Specifically, the control unit 16 controls the application time and amount of the voltage (bias) as set previously.

On the basis of such a structure, the organic EL device 1 according to the embodiment is supposed to drive the luminescence of the first organic luminescence layer 6 and the second organic luminescence layer 7 through the power switching unit 13 and the control unit 16 for controlling the power switching unit 13.

In other words, through the control unit 16 and the power switching unit 13, it is possible to achieve forward driving which allows the first terminal 12 side, that is, the first electrode 3 and the third electrode 5 to serve as an anode and the second terminal 14 side, that is, the second electrode 4 to serve as a cathode, and simultaneously inverse driving which allows the first terminal 12 side, that is, the first electrode 3 and the third electrode 5 to serve as a cathode and the second terminal 14 side, that is, the second electrode 4 to serve as an anode. In addition, it is possible to perform switching between forward driving and inverse driving via the power switching unit 13.

If forward driving is performed in the embodiment, especially in the first organic luminescence layer 6, a forward voltage (bias) is applied, so that a forward current flows, thereby generating the luminescence. On the other hand, in the second organic luminescence layer 7, an inverse voltage (bias) is applied. In this case, a forward current does not flow, thereby not generating the luminescence.

Further, if inverse driving is performed, in the first organic luminescence layer 6, an inverse voltage (bias) is applied, so that a forward current does not flow, and then the luminescence does not generate. On the other hand, in the second organic luminescence layer 7, a forward voltage (bias) is applied, so that a forward current flows, and then the luminescence generates.

Accordingly, if forward driving is performed through the power switching unit 13, it is possible to allow the first organic luminescence layer 6 to selectively emit light, and if inverse driving is performed, it is possible to allow the second organic luminescence layer 7 to selectively emit light. Therefore, both of the luminescence (for example, the red luminescence) in the first organic luminescence layer 6 and the luminescence (for example, the blue luminescence) in the second organic luminescence layer 7, that is, the luminescence of the plural colors, can be achieved via switching of the power switching unit 13.

Further, by controlling the switching of the power switching unit 13 through especially the control unit 16, the luminescence of the mixed color (combined color) of the luminescence (for example, the red luminescence) in the first organic luminescence layer 6 and the luminescence (for example, the blue luminescence) in the second organic luminescence layer 7 can be performed. That is, in case of performing switching between the first organic luminescence layer 6 and the second organic luminescence layer 7 at high speed, it is possible to follow the switching rate having a frequency of about 30 Hz to about 60 Hz in a human eye. In case of exceeding this range, however, it is visible as both colors are mixed. Accordingly, by using this, it is possible to allow a mixed color of the luminescence in the first organic luminescence layer 6 and the luminescence in the second organic luminescence layer 7, that is, the color obtained from the composition to emit light.

At this time, by using the control unit 16, it is preferable to make a difference between the application time of the forward voltage (bias) for forward driving and the application time of the inverse voltage (bias) for inverse driving or make a difference between the application amount of the forward voltage (bias) for forward driving and the application amount of the inverse voltage (bias) for inverse driving. In addition, it is preferable to make a difference respectively between the application time and amount of the voltage (bias). Thus, by changing suitably the difference between the application time and/or amount of the voltage (bias) via the control unit 16, it is possible to display a color obtained from a composition of a color from the first organic luminescence layer 6 and a color from the second organic luminescence layer 7 with a better gray scale level.

Herein, for the organic EL device 1 having such a structure, to form each electrode and each organic luminescence layer, first, the substrate 2 is prepared. Then, ITO as a transparent conductive film is formed on the substrate 2 using a vapor deposition method or a sputter method, thereby forming the first electrode 3. Then, if necessary, a plasma treatment is conducted on the first electrode 3 to clean a surface of the first electrode 3 and to grant the lyophilic to a surface of the first electrode 3. This O2 plasma treatment is conducted under a condition that a plasma power is 100 to 800 kW, an oxygen gas flow is 50 to 100 ml/min, a substrate carrying speed is 0.5 to 10 mm/sec, and a substrate temperature is 70 to 90° C.

Next, the first hole injecting layer 8 and the first luminescence layer 9 are sequentially formed on the first electrode 3, thereby forming the first organic luminescence layer 6. That is, the first hole injecting layer 8 is firstly formed. For a forming process of the first hole injecting layer 8, a method for forming a thin film in the order of several nm to several hundreds nm through a liquid phase process is appropriately adopted. The liquid phase process is a method of forming a thin film by making a material for film forming as a liquid body by solution or dispersion and by processing the liquid body with the spin coating method, the dipping method or the droplet ejecting method (inkjet method).

Moreover, while the droplet ejecting method is capable of patterning a thin film in an arbitrary position, the spin coating method or the dipping method is suitable for an entire surface applying. Accordingly, in a forming process of the hole transporting layer, a hole injecting layer material is applied on the first electrode 3 through the spin coating method or dipping method.

By doing so, the hole injecting layer material is applied on the first electrode 3, and then a drying and heating treatment are performed to evaporate the dispersion medium or solvent contained in the hole transporting layer material. As a result, the first hole injecting layer 8 is formed on the first electrode 3. For the drying treatment, it is preferably performed under a condition that a pressure at a room temperature is about 133.3 Pa (1 Torr) in a nitrogen atmosphere. Further, for the heating treatment after the drying treatment, it is preferably performed under a condition of 200° C. for about 10 minutes in vacuum.

In addition, after the forming process of the hole transporting layer, the process is preferably performed in an inert gas atmosphere such as nitrogen and argon to prevent the oxidization of the first hole injecting layer 8 and the first luminescence layer 9.

Subsequently, the first luminescence layer 9 is formed. In the forming process of the luminescence layer, since the polymer material is used for the luminescence material, a wet method, such as especially the spin coating method or the dipping method, for a film forming method can be adopted. In other words, after the luminescence layer forming material is applied on the first hole injecting layer 8 using the spin coating method or dipping method, the drying and heating treatments are performed. As a result, the first luminescence layer 9 can be formed on the first hole injecting layer 8. Herein, if the luminescence layer forming material especially is applied using the spin coating method or dipping method, the drying treatment is preferably performed by spraying nitrogen on the substrate 2 or causing a gas flow in the surface of the substrate to be generated by a rotation of the substrate 2.

Then, the second electrode 4 can be formed on the first organic luminescence layer 6. In the electrode forming process, the codeposition film of BCP (Bathocuproine) and cesium is formed using, for example, the vapor deposition method, and further ITO is formed thereon with the vapor deposition method or sputter method, thereby forming the second electrode 4 having a laminated structure.

Next, the second organic luminescence layer 7 is formed on the second electrode 4. For forming the second organic luminescence 7, in case of forming the second luminescence layer 11 with a polymer material, like the first luminescence layer 9 in the first organic luminescence layer 6, each of the second hole injecting layer 10 and the second luminescence layer 11 is formed of the material as described above with the wet method, like forming the second organic luminescence layer 7.

Further, if the second luminescence layer 11 especially is formed of the monomer material as described above, a second organic luminescence layer 7 is formed by sequentially depositing a hole transporting layer, a luminescence layer and an electron transporting layer from the second electrode 4 side. In this case, each of these layers can be formed by the vapor deposition method or the sputter method, for example. If adopting the vapor deposition method or the sputter method, the film forming can be performed in a vacuum atmosphere or a compressed atmosphere. Accordingly, deterioration due to oxygen or moisture of the first luminescence layer 9 in the first organic luminescence layer 6 or the second electrode 4 can be prevented.

Then, a third electrode 5 can be formed on the second organic luminescence layer 7. In the electrode forming process, the polymer material may be used for the luminescence layer (the second luminescence layer 11) in the second organic luminescence layer 7. In this case, a ultra-thin film cathode **5*a* is formed of a codeposition film of BCP (Bathocuproine) and cesium via the vapor deposition method, and has Al formed thereon. The reflecting electrode 5*b* is formed, thereby forming the third electrode 5 having a laminated structure. In addition, the monomer material may be used for the luminescence layer (the second luminescence layer 11) in the second organic luminescence layer 7. In this case, by forming MgAg through the vapor deposition method or the sputter method or by depositing LiF and Al in that order, the third electrode 5 can be obtained. In addition, the third electrode 5 can be transparent to serve as a top emission type. In case of see-through type, a ultra-thin film (several nm) made of a metal, such as Ca having a small work function or its fluoride, a mixture of an organic material and a film of a transparent conductive film such as ITO are laminated with the vapor deposition method or the sputter method. By doing so, the third electrode 5** is formed.

In the organic EL device 1 obtained by doing so, both of the luminescence in the first organic luminescence layer 6 (for example, red luminescence) and the luminescence in the second organic luminescence layer 7 (for example, blue luminescence), that is, the luminescence of the plural colors, can be achieved by switching of the power switching unit 13. Accordingly, only by newly adding an electrode and an organic luminescence layer to the conventional structure, the luminescence of the plural colors can be achieved. As a result, the organic EL device 1. is capable of performing satisfactorily multicolor (plural colors) luminescence with a simplified structure.

In addition, the invention can be various modifications within the scope of the present invention without being limited to the embodiment. In the embodiment, any one of the first electrode 3, the second electrode 4 and the third electrode 5 has a structure of a solid film shape made of a single-layered film or a laminated film which is not patterned, but, as an alternative, the patterned electrode can be advantageously adopted. In that case, by patterning only the first electrode 3 in a shape of characters and the like or patterning in a dot shape, the luminescence from the first organic luminescence layer can be achieved corresponding to the patterning shape of the first electrode 3.

Figure 3:
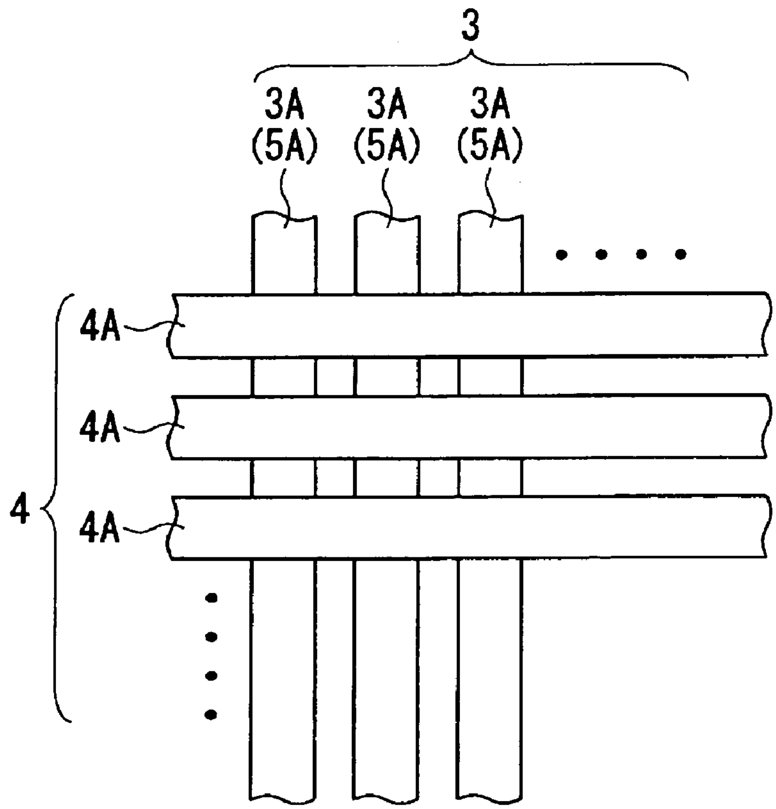
FIG. 3 is a plan view illustrating an arrangement of electrodes when a passive matrix driving is performed.

Further, especially the luminescence of the first organic luminescence layer 6 may be driven in a passive matrix manner. Namely, as shown in FIG. 3, the first electrode 3 is formed of a plurality of stripe-shape electrodes 3A arranged in parallel to each other, and the second electrode 4 is formed of a plurality of stripe-shape electrodes 4A arranged in parallel to each other, wherein each of the plurality of the stripe-shape electrodes 4A is arranged to perpendicularly cross the stripe-shape electrodes 3A of the first electrode 3. By forming the first electrode 3 and the second electrode 4, the luminescence in the first organic luminescence layer 6 can be achieved through the passive matrix driving. Accordingly, further complicated display can be performed through the first organic luminescence layer 6.

In addition, for the luminescence of the second organic luminescence layer 7, it is possible to perform in the passive matrix driving. That is, in addition to the configuration of the first electrode 3 and the second electrode 4 as shown in FIG. 3, the third electrode 5 includes a plurality of stripe-shape electrodes 5*a* arranged in parallel to each other, and the plurality of stripe-shape electrodes 5*a* are arranged directly above the stripe-shape electrodes 3*a* of the first electrode 3.

If doing so, when viewing from a direction perpendicular to the substrate 2, that is, a direction to which the luminescent light is emitted, the third electrode 5 is arranged overlapping in a position of the first electrode 3. Accordingly, it can achieve the luminescence through the same passive matrix driving in the first organic luminescence layer 6 and the second organic luminescence layer 7. Therefore, in the second organic luminescence layer 7, further complicated display can be performed.

Further, in the embodiment, the first electrode 3, the second electrode 4 and the third electrode 5 is formed, and the first organic luminescence layer 6 and the second organic luminescence layer 7 are formed between the electrodes. However, it should be understood that the invention may further increase the number of the electrodes and the number of the organic luminescence layers. That is, in addition to the first, second and third electrodes, a fourth electrode may be formed on the third electrode 5, and further a third organic luminescence layer may be formed between the third electrode 5 and the fourth electrode. Further, by electrically connecting the fourth electrode to the second electrode, it is possible to make the first organic luminescence layer and the third organic luminescence layer emit light equally. In this case, by allowing the first organic luminescence layer and the third organic luminescence layer especially to achieve the luminescence of the same color, it can seek the brightness enhancement of the luminescence from the first and third organic luminescence layers.

In addition, a fifth electrode, a sixth electrode, . . . , and the like may be further formed and simultaneously a fourth organic luminescence layer, a fifth organic luminescence layer, . . . , and the like may be formed. In this case, odd-numbered organic luminescence layer and even-numbered organic luminescence layer may be set to achieve the luminescence of the same color, thereby seeking the brightness enhancement of the luminescence from each organic luminescence layer.

Subsequently, an illumination device comprising the organic EL device 1 as a light source, and an electronic apparatus comprising the organic EL device 1 will be illustrated.

Figure 4:
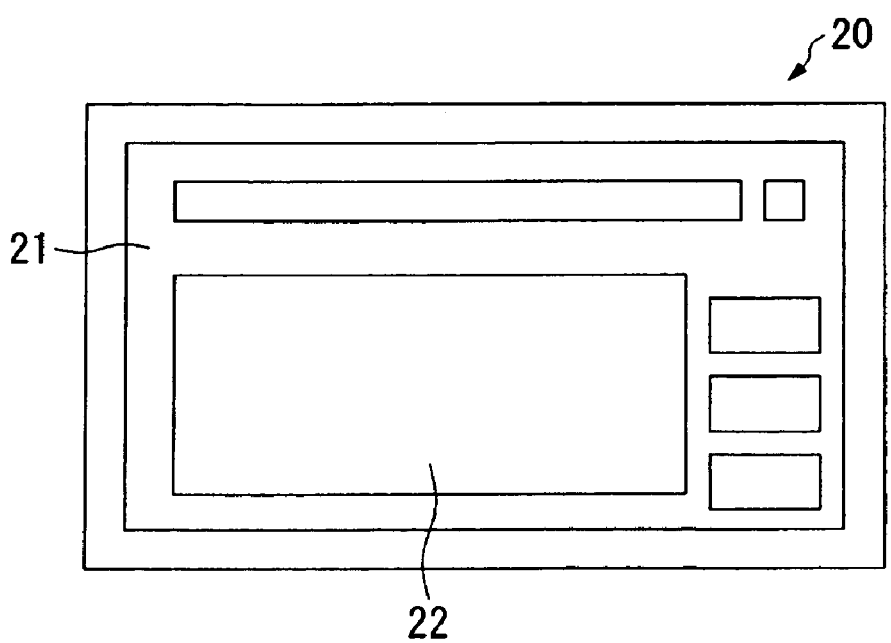
FIG. 4 shows an example of an electronic apparatus and illumination device.

FIG. 4 shows an exemplary embodiment in which the electronic apparatus and the illumination device according to the invention are applied to the car stereo and its display panel, respectively. In FIG. 4, a reference numeral "20" represents the car stereo as the electronic apparatus, and a reference numeral "21" represents the display panel as the illumination device. The display panel 21 is attached to an operation surface of the car stereo 20, and in its central portion, a display unit 22 is arranged.

The display unit 22 can include a light source (not shown) which serves as a backlight and a liquid crystal display unit (not shown) arranged in a front side of the light source, and is constituted such that the display of characters and the like in the liquid crystal display unit is ornamented by the light source that serves as the backlight. Herein, the light source that serves as the backlight is made of the organic EL device 1 as shown in FIG. 1, which is operable such that the luminescence color in the first organic luminescence layer 6, the luminescence color in the second organic luminescence layer 7, and their mixed color (composition color) are displayed in a high gray scale level. Accordingly, when various displays are conducted in the liquid crystal display unit, its background color is suitably changeable, thereby enhancing the ornamental property of a car stereo 20 and a display panel 21.

Moreover, if one achieving the passive matrix driving as described above is used for the organic EL device 1, the display unit 22 may be made only with the organic EL device 1 without using a liquid crystal display device.

Further, it should be understood that the illumination device or electronic apparatus of the invention has various applications without being limited to the embodiments. For example, for the illumination device, it is applicable to various illuminations that use the organic EL device as a light source. In addition, for the electronic apparatus, it may be applied to a mobile phone or various displays.

While this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. An organic electroluminescent device including:

a first electrode, a second electrode, and a third electrode that are formed on a substrate in that order;

a first organic luminescence layer disposed between the first electrode and the second electrode and formed of at least one layer;

a second organic luminescence layer disposed between the second electrode and the third electrode and formed of at least one layer, the first electrode and the third electrode being electrically coupled to each other, the second electrode having transparency, and at least one of the first electrode and the third electrode having transparency; and a power switching unit that enables switching between forward driving which allows the first electrode and the third electrode to serve as an anode and allows the second electrode to serve as a cathode, and inverse driving which allows the first electrode and the third electrode to serve as a cathode and allows the second electrode to serve as an anode.

2. The organic electroluminescent device according to claim 1, the first organic luminescence layer being made of a polymer material and the second organic luminescence layer being made of a monomer material.

3. The organic electroluminescent device according to claim 1, the luminescence of at least the first organic luminescence layer of the first and second organic luminescence layer being driven in a passive matrix manner.

4. The organic electroluminescent device according to claim 3, the first electrode including a plurality of stripe-shape electrodes that are arranged in parallel to each other, and the second electrode including a plurality of stripe-shape electrodes that are arranged in parallel to each other and arranged to perpendicularly cross the first electrode.

5. The organic electroluminescent device according to claim 4, the third electrode including a plurality of stripe-shape electrodes that are arranged in parallel to each other, and the plurality of the stripe-shape electrodes being arranged directly above the first electrode.

6. The organic electroluminescent device according to claim 1, the power switching unit being provided with a control unit for respectively controlling an application time and amount of a forward bias when forward driving is performed, and an application time and amount of an inverse bias when inverse driving is performed.

7. A method for driving an organic electroluminescent device claimed in claim 1, the method comprising:

when performing switching between forward driving and inverse driving at high speed, making a difference between an application time of a forward bias in forward driving and an application time of an inverse bias in inverse driving.

8. A method for driving an organic electroluminescent device claimed in claim 1, the method comprising:

when performing switching between forward driving and inverse driving at high speed, making a difference between an application amount of a forward bias in forward driving and an application amount of an inverse bias in inverse driving.

9. A method for driving an organic electroluminescent device claimed in claim 1, the method comprising:

when performing switching between forward driving and inverse driving at high speed, making a difference between an application time and amount of a forward bias in forward driving and an application time and amount of an inverse bias in inverse driving, respectively.

10. An illumination device using the organic electroluminescent device claimed in claim 1 as a light source.

11. An electronic apparatus including the organic electroluminescent device claimed in claim 1.

* * * * *